US011233086B2

(12) United States Patent
Chen

(10) Patent No.: US 11,233,086 B2
(45) Date of Patent: Jan. 25, 2022

(54) SEMICONDUCTOR STRUCTURE OF IMAGE SENSOR, CHIP AND ELECTRONIC APPARATUS

(71) Applicant: SHENZHEN GOODIX TECHNOLOGY CO., LTD., Guangdong (CN)

(72) Inventor: Ching-Wei Chen, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 99 days.

(21) Appl. No.: 16/749,754

(22) Filed: Jan. 22, 2020

(65) Prior Publication Data

US 2021/0098522 A1  Apr. 1, 2021

Related U.S. Application Data

(63) Continuation of application No. PCT/CN2019/109426, filed on Sep. 30, 2019.

(51) Int. Cl.
*H01L 27/146* (2006.01)

(52) U.S. Cl.
CPC .. *H01L 27/14641* (2013.01); *H01L 27/14605* (2013.01); *H01L 27/14645* (2013.01)

(58) Field of Classification Search
CPC ......... H01L 27/14641; H01L 27/14605; H01L 27/14645; H01L 27/14616;
(Continued)

(56) References Cited

U.S. PATENT DOCUMENTS

2008/0088724 A1* 4/2008 Kudoh ................ H04N 5/3741
  348/300
2011/0073923 A1* 3/2011 Tatani ................ H01L 27/1463
  257/291
(Continued)

FOREIGN PATENT DOCUMENTS

CN  104617116 A  5/2015
CN  108174128 A  6/2018
(Continued)

OTHER PUBLICATIONS

English Abstract Translation of Foreign Reference CN104617116A.
(Continued)

*Primary Examiner* — Bitew A Dinke
(74) *Attorney, Agent, or Firm* — WPAT, P.C., Intellectual Property Attorneys; Anthony King

(57) ABSTRACT

The present invention discloses a semiconductor structure of an image sensor, an associated chip and an electronic apparatus. The semiconductor structure includes a semiconductor substrate, and a plurality of pixel groups disposed on the bottom of the semiconductor substrate. Each of the pixel groups includes: a first pixel and a second pixel located in the same row and being adjacent to each other, and a third pixel and a fourth pixel located in another row and being adjacent to each other, wherein the first pixel and the third pixel are disposed diagonally. Each of the pixels includes four sub-pixels, and the four sub-pixels of each pixel share a floating diffusion region and the floating diffusion region is surrounded by photodetectors of the four sub-pixels. An output circuit is shared by the first pixel and the third pixel, and the shared output circuit of the first pixel and the third pixel is located between the first pixel and the third pixel, and extends to the left/right side of the first pixel and the right/left side of the third pixel. The present application is
(Continued)

capable of enhancing image quality of the image sensor and improving performance of the output circuit.

18 Claims, 5 Drawing Sheets

(58) Field of Classification Search
CPC ......... H01L 27/14609; H01L 27/14603; H01L 27/14636; H01L 27/14643; H04N 9/04551; H04N 5/357; H04N 5/37457; H04N 5/374
See application file for complete search history.

(56) References Cited

U.S. PATENT DOCUMENTS

| | | | | |
|---|---|---|---|---|
| 2011/0273597 | A1* | 11/2011 | Ishiwata | H01L 27/14605 348/272 |
| 2014/0239152 | A1* | 8/2014 | Chen | H01L 27/14612 250/208.1 |
| 2015/0002709 | A1 | 1/2015 | Masagaki | |
| 2015/0123172 | A1 | 5/2015 | Chen et al. | |
| 2017/0110503 | A1* | 4/2017 | Kato | H01L 27/14645 |
| 2017/0200761 | A1* | 7/2017 | Lee | H01L 27/14605 |
| 2017/0236859 | A1* | 8/2017 | Otake | H01L 27/14616 257/290 |
| 2017/0287955 | A1* | 10/2017 | Ukigaya | H01L 27/1463 |
| 2018/0182804 | A1* | 6/2018 | Lee | H01L 27/14636 |
| 2019/0019835 | A1* | 1/2019 | Tanaka | H04N 9/04561 |
| 2019/0237497 | A1 | 8/2019 | Kwag | |
| 2020/0203416 | A1* | 6/2020 | Jin | H01L 27/14607 |

FOREIGN PATENT DOCUMENTS

| | | |
|---|---|---|
| CN | 110099228 A | 8/2019 |
| EP | 3518518 | 7/2019 |
| JP | 2015012303 A | 1/2015 |
| WO | WO2016158439 A1 | 10/2016 |
| WO | WO2020011285 A2 | 1/2020 |

OTHER PUBLICATIONS

English Abstract Translation of Foreign Reference CN108174128A.
English Abstract Translation of Foreign Reference CN110099228A.
English Abstract of JP2015012303A (JP 2015-12303 A).
International Search Report in Chinese (Form PCT/ISA/210) of PCT/CN2019/109426.
Notification of Receipt of Search Chinese (Form PCT/ISA/202) of PCT/CN2019/109426.
Notification of the International Application Number and of the International Filing Date in Chinese (Form PCT/RO/105) of PCT/CN2019/109426.
As-filed PCT Request of PCT/CN2019/109426.
As-filed PCT Application of PCT/CN2019/109426.
Receipt for the filing of PCT/CN2019/109426.
PCT/IB/345 form which acknowledges request for early publication and correction of publication date.

* cited by examiner

SEMICONDUCTOR STRUCTURE OF IMAGE SENSOR, CHIP AND ELECTRONIC APPARATUS

CROSS REFERENCE TO RELATED APPLICATIONS

The present application is a continuation of international application No. PCT/CN2019/109426, filed on Sep. 30, 2019, which is hereby incorporated by reference in its entirety.

TECHNICAL FIELD

The present application relates to a semiconductor structure of an image sensor, an associated chip and an electronic apparatus, and more particularly, to a semiconductor structure of an image sensor capable of increasing a channel length of a source follower transistor, an associated chip and an electronic apparatus.

BACKGROUND

CMOS image sensors are being produced and applied in large scales. Along with the elevated requirements for image quality, the number of pixels is also ever-increasing. In order to maximize the number of pixels in a limited area, the size of unit pixels needs to be minimized That is to say, the sizes of photodetectors and output circuits in the unit pixels also need to be reduced as well.

However, reducing the size of an output circuit frequently affects the performance of the output circuit. Therefore, how to attend to both area and performance is a critical work item of the present field. In addition, a problem of image imbalance easily occurs in CMOS image sensors of the prior art.

SUMMARY OF THE INVENTION

It is an object of the present application to disclose a semiconductor structure of an image sensor, an associated chip and an electronic apparatus for solving the problems above.

A semiconductor structure of an image sensor is disclosed by an embodiment of the present invention. The semiconductor structure of an image sensor includes: a semiconductor substrate, and a plurality of pixel groups disposed on the bottom of the semiconductor substrate. Each of the pixel groups includes a first pixel and a second pixel located in the same row and being adjacent to each other, and a third pixel and a fourth pixel located in another row and being adjacent to each other. The first pixel and the third pixel are disposed diagonally, and the first pixel and the third pixel are pixels of the same color. Each of the first pixel, the second pixel, the third pixel and the fourth pixel includes four sub-pixels arranged in two rows and two columns. The four sub-pixels of each pixel share a floating diffusion region and the floating diffusion region is surrounded by photodetectors of the four sub-pixels, wherein the photodetectors are for converting light into electric charge. An output circuit is shared by the first pixel and the third pixel. The shared output circuit of the first pixel and the third pixel is located between the first pixel and the third pixel and extends to the left/right side of the first pixel and the right/left side of the third pixel, a part of the output pixel is adjacent to the photodetectors of the first pixel, and the other part of the output circuit is adjacent to the photodetectors of the third pixel. The output circuit is for generating pixel output according to the electric charge, and the output circuit includes a first source follower circuit. From a top view, a part of the first source follower transistor is located to one side of a boundary between the first pixel and the third pixel, and is at least adjacent to the photodetectors on the left/right side of the first pixel; the other part of the first source follower transistor is located to the other side of the boundary between the first pixel and the third pixel, and is at least adjacent to the photodetectors on the right/left side of the third pixel.

A chip disclosed by an embodiment of the present application includes the above-described semiconductor structure of an image sensor.

An electronic apparatus disclosed by an embodiment of the present application includes the above-described semiconductor structure of an image sensor.

The embodiments of the present application provide improvement to the configuration of an output circuit of the semiconductor structure of an image sensor, and are capable of decreasing the area and improving the performance of the output circuit.

DETAILED DESCRIPTION OF THE EMBODIMENTS

Figure 1:
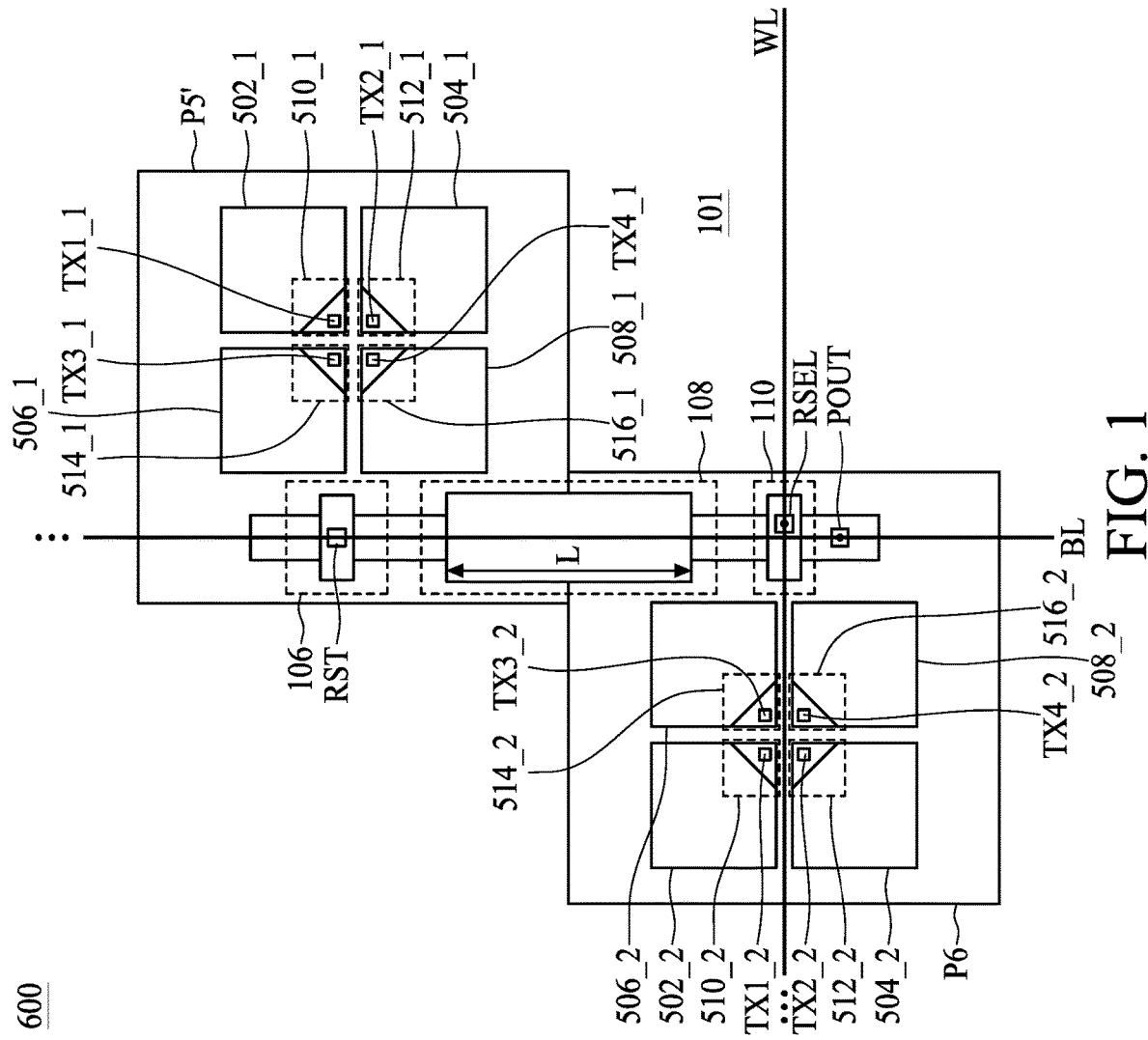
FIG. 1 is a top view of a semiconductor structure of an image sensor according to an embodiment of the present application.

In the description below, multiple embodiments or examples are provided for implementing different features of the disclosure of the present application. Specific examples of components and configurations described below are for simplifying the disclosure of the present application. It can be conceived that the description provides examples and is not to be construed as limitations to the disclosure of the present application. For example, in the description below, forming a first feature on or above a second feature may include a situation where the first and second features are in direct contact in some embodiments, or may include a situation where an additional component is formed between the first and second features in some embodiments in a way that the first and second features are not in direct contact. Further, the symbols and/or numerals may be repeatedly used in multiple embodiments in the disclosure of the present application; such repeated use is for the sake of brevity and clarity, and does not represent the relationships between different embodiments and/or configurations discussed.

In addition, terms used for spatial relativity, for example, "under", "below", "lower than", "on", "above" and other similar terms, may be used for better explaining the relationship of one component or feature relative to another or multiple components and features. The terms of spatial relativity cover, in addition to orientations depicted in the drawings, multiple other different orientations of use and operation of the apparatus. The apparatus may be placed as having another orientation (e.g., located by 90 degrees or located as having another orientation), and these descriptive terms of spatial relativity should then be correspondingly interpreted.

Although numerical values and parameters defining broader ranges of the present application are all approximate values, related values in specific embodiments are presented as accurately as possible. However, any value essentially inevitably contains a standard deviation caused by individual test methods. Herein, the term "approximately" usually refers to that an actual value is within positive/negative 10%, 5%, 1% or 0.5% of a specific value or range. Alternatively, the term "approximately" refers to that an actual value falls within an acceptable standard deviation of an average value, which can be determined on the basis of consideration of a person of ordinary skill in the technical field of the present application. It should be understood that, in addition to experimentation examples, unless otherwise specified, ranges, quantities, values and percentages (for example, for describing the amount of material used, the length of a time period, temperature, operating conditions, the ratio of quantity and the like) used herein have all been modified by "approximately". Therefore, unless opposite description is given, the values and parameters disclosed by the description and the appended claims are all approximate values, and can be modified according to requirements. These values and parameters should be at least understood as values of valid digits indicated or values obtained by common carry methods. Herein, a value range represents from one end point to another end point or between two end points; unless otherwise specified, all value ranges include the end points.

High-resolution or even ultra-high-resolution CMOS image sensors are more and more extensively applied and demanded, and the size of unit pixels needs to be reduced as well. That is to say, the sizes of photodetectors and output circuits in unit pixels also need to be reduced, in a way that the performance of the output circuits is inevitably affected. For example, when the channel length of a source follower transistor in an output circuit is reduced, random telegraph signal noise is increased. The semiconductor structure of an image sensor of the present application is capable of decreasing the area of pixels by changing the configuration of the output circuit, and reducing the random telegraph signal noise by increasing the channel length of the source follower transistor in the output circuit. Further, by changing the configuration of the output circuit, the present application further allows pixels of the same color in the same pixel group to share the same reading circuit, so as to improve the issue of output inconsistency of pixels of the same color. For example, the present invention allows green pixels Gr and Gb in the same pixel group in a Bayer pixel array to use the same reading circuit, so as to avoid the issue of image imbalance between the green pixels Gr and Gb caused by different reading circuits of the green pixels Gr and Gb.

Figure 2:
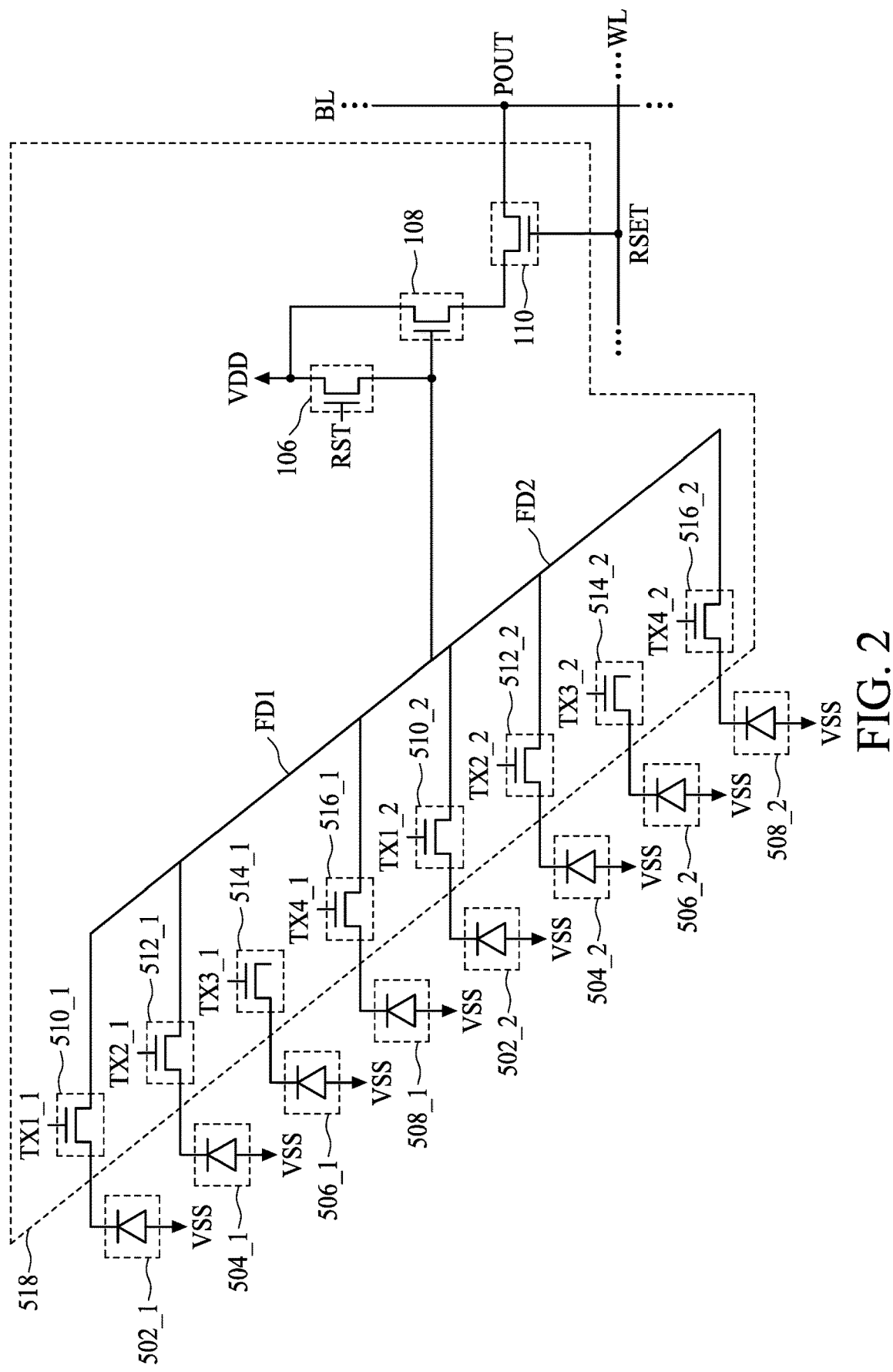
FIG. 2 is a circuit diagram of pixels of the image sensor in FIG. 1.

FIG. 1 shows a top view of a semiconductor structure of an image sensor according to an embodiment of the present application. The image sensor 600 in FIG. 1 includes a shared pixel P5' having a 2×2 basis and a shared pixel P6 having a 2×2 basis, and the pixel P5' and the pixel P6 together form a pixel unit group. It should be noted that, although only the pixel P5' and the pixel P6 in the image sensor 600 are depicted in FIG. 1, the image sensor 600 can include multiple of the unit pixel groups. FIG. 2 shows a circuit diagram of the image sensor 600 in FIG. 1.

Refer to FIG. 1 and FIG. 2. The image sensor 600 includes a semiconductor substrate 101, and the pixel P5' and the pixel P6 disposed on the semiconductor substrate 101. The semiconductor substrate 101 can be a block-like semiconductor substrate, such as a silicon substrate or a silicon-on-insulator (SOI) substrate. More specifically, each of the pixel P5' and the pixel P6 includes four sub-pixels so as to form shared pixels P5' and P6 having the 2×2 basis, the pixel P5' includes the four sub-pixels of the pixel P5' corresponding to four photodetectors 502_1, 504_1, 506_1 and 508_1, and the pixel P6 includes the four sub-pixels of the pixel P6 corresponding to four photodetectors 502_2, 504_2, 506_2 and 508_2. Further, the pixel P5' and the pixel P6 have an output circuit 518, that is, the output circuit 518 is shared by the pixel P5' and the pixel P6. The pixel P5' includes four transmission gates 510_1, 512_1, 514_1 and 516_1 so as to correspond to the four photodetectors 502_1, 504_1, 506_1 and 508_1, and the pixel P6 includes four transmission gates 510_2, 512_2, 514_2 and 516_2 so as to correspond to the four photodetectors 502_2, 504_2, 506_2 and 508_2. The anodes of the photodetectors 502_1, 504_1, 506_1, 508_1, 502_2, 504_2, 506_2 and 508_2 are electrically connected to a first voltage VSS, and the photodetectors 502_1, 504_1, 506_1, 508_1, 502_2, 504_2, 506_2 and 508_2 are for converting light into electric charge. It should be noted that, the range of the output circuit 518 is not additionally indicated in FIG. 1 for brevity, and the output circuit 518 is only depicted in FIG. 2.

The output circuit 518 is for generating pixel output according to the electric charge generated by the photodetectors 502_1, 504_1, 506_1, 508_1, 502_2, 504_2, 506_2 and 508_2. The output circuit 518 includes the transmission gates 510_1, 512_1, 514_1, 516_1, 510_2, 512_2, 514_2 and 516_2, a reset transistor 106, a source follower transistor 108, and a row select transistor 110. As shown in FIG. 1, a boundary is present between the pixel P5' and the pixel P6, that is, an intersection of the lower border of the pixel P5' and the upper border of the pixel P6. The output circuit 518 (i.e., the transmission gates 510_1, 512_1, 514_1, 516_1, 510_2, 512_2, 514_2 and 516_2, the reset transistor 106, the source follower transistor 108, and the row select transistor 110) cross the boundary of the pixel P5' and the pixel P6, and are arranged such that a part of the output circuit 518 is adjacent to the photodetectors 502_1, 504_1, 506_1 and 508_1 of the pixel P5' and the other part of the output circuit 518 is adjacent to the photodetectors 502_2, 504_2, 506_2 and 508_2 of the pixel P6. Each of the transmission gates 510_1, 512_1, 514_1, 516_1, 510_2, 512_2, 514_2 and 516_2 include a gate and two sources/drains. The gates of the transmission gates 510_1, 512_1, 514_1, 516_1, 510_2, 512_2, 514_2 and 516_2 respectively correspond to the photodetectors 502_1, 504_1, 506_1, 508_1, 502_2, 504_2, 506_2 and 508_2, and respectively determine whether to turn on or turn off the transmission gates 510_1, 512_1, 514_1, 516_1, 510_2, 512_2, 514_2 and 516_2 according to control signals TX1_1, TX2_1, TX3_1, TX4_1, TX1_2, TX2_2, TX3_2 and TX4_2 of the transmission gates.

The four sub-pixels of the pixel P5' share a floating diffusion region FD1, and the floating diffusion region 1-D1 is surrounded by the photodetectors 502_1, 504_1, 506_1 and 508_1 of the four sub-pixels. The four sub-pixels of the pixel P6 share a floating diffusion region FD2, and the floating diffusion region FD2 is surrounded by the photodetectors 502_2, 504_2, 506_2 and 508_2 of the four sub-pixels. The two sources/drains of each of the transmission gates 510_1, 512_1, 514_1, 516_1, 510_2, 512_2, 514_2 and 516_2 are electrically connected between the photodetectors 502_1, 504_1, 506_1, 508_1, 502_2, 504_2, 506_2 and 508_2 and the floating diffusion regions FD1 and FD2. The source follower transistor 108 is disposed between the reset transistor 106 and the row select transistor 110. The row select transistor 110 and the first reset transistor 106 are symmetrically disposed along the source follower transistor 108. The transmission gates 510_1, 512_1, 514_1 and 516_1 in the pixel P5' are evenly arranged in the pixel P5', and the transmission gates 510_2, 512_2, 514_2 and 516_2 in the pixel P6 are evenly arrange in the pixel P6.

More specifically, the gate of the source follower transistor 108 and one source/drain of the reset transistor 106 are both electrically connected to the floating diffusion regions FD1 and FD2, and the other source/drain of the reset transistor 106 is electrically connected to a second voltage VDD, wherein the second voltage VDD is different from the first voltage VSS. The gate of the reset transistor 106 determines according to control of a reset signal RST whether it is to be conducted. The source follower transistor 108 is connected in series to the row select transistor 110, one source/drain of the source follower transistor 108 is electrically connected to one source/drain of the row select transistor 110, and the other source/drain of the source follower transistor 108 is electrically connected to the second voltage VDD. The other source/drain of the row select transistor 110 serves as an output terminal POUT of the pixel output and is electrically connected to a bit line BL, and the gate of the row select transistor 110 determines according to a row selecting signal RSEL on a word line WL whether it is to be conducted to output the pixel output from the output terminal POUT to the bit line BL.

From a top view of the semiconductor structure of the pixel P5' and the pixel P6, in some embodiments, the row select transistor 110, the source follower transistor 108 and the reset transistor 106 are arranged in a column to form a transistor column. More specifically, each of the pixel P5' and the pixel P6 in FIG. 1 has a range, and an adjacent junction of the pixel P5' and the pixel P6 forms a boundary between the pixel P5' and the pixel P6. The source follower transistor 108 crosses between the pixel P5' and the pixel P6; that is, the source follower transistor 108 crosses the boundary between the pixel P5' and the pixel P6 and are disposed accordingly, and extends to the pixel P5' and the pixel P6. From the top view, a part of the source follower transistor 108, that is, the top part of the source follower transistor 108, is located to one side of the boundary of the pixel P5' and the pixel P6, and is at least adjacent (i.e., left and right adjacent) to the photodetectors 502_1, 504_1, 506_1 and 508_1 of the pixel P5'; the other part of the source follower transistor 108, that is, the bottom part of the source follower transistor 108, is located to the other side of the boundary of the pixel P5' and the pixel P6, and is at least adjacent (i.e., left and right adjacent) to the photodetectors 502_2, 504_2, 506_2 and 508_2 of the pixel P6. The reset transistor 106 is disposed at the pixel P5', and the reset transistor 106 is adjacent to the photodetectors 502_1, 504_1, 506_1 and 508_1 of the pixel P5'. The row select transistor 110 is disposed at the pixel P6, and the row select transistor 110 is adjacent to the photodetectors 502_2, 504_2, 506_2 and 508_2 of the pixel P6. The pixel P5' and the pixel P6 share the output terminal POUT. Compared to a conventional pixel arrangement, the present application configures the pixel P5' and the pixel P6 into one group such that the pixel P5' and the pixel P6 share the output circuit 518, and breaks the boundary between the pixel P5' and the pixel P6 and disposes the output circuit 518 as crossing between the pixel P5' and the pixel P6, such that the source follower transistor 108 originally limited within the range of the pixel P5' or the pixel P6 is able to cross the boundary between the pixel P5' and the pixel P6, thereby increasing design flexibilities; that is to say, additional space is earned to increase the length of the source follower transistor 108. Since the channel length L of the source follower transistor 108 is directly associated with the length of the source follower transistor 108, by increasing the channel length L of the source follower transistor 108, the present application achieves the objects of decreasing the areas of the pixel P5' and the pixel P6 as well as reducing random telegraph signal noise.

As previously described, from the top view of the semiconductor structure of the pixel P5' and the pixel P6, in some embodiments, the row select transistor 110, the source follower transistor 108 and the reset transistor 106 are arranged in one column to form a transistor column, and the photodetectors 502_1, 504_1, 506_1 and 508_1 of the pixel P5' and the photodetectors 502_2, 504_2, 506_2 and 508_2 of the pixel P6 are disposed on one different side from the transistor column.

Figure 3:
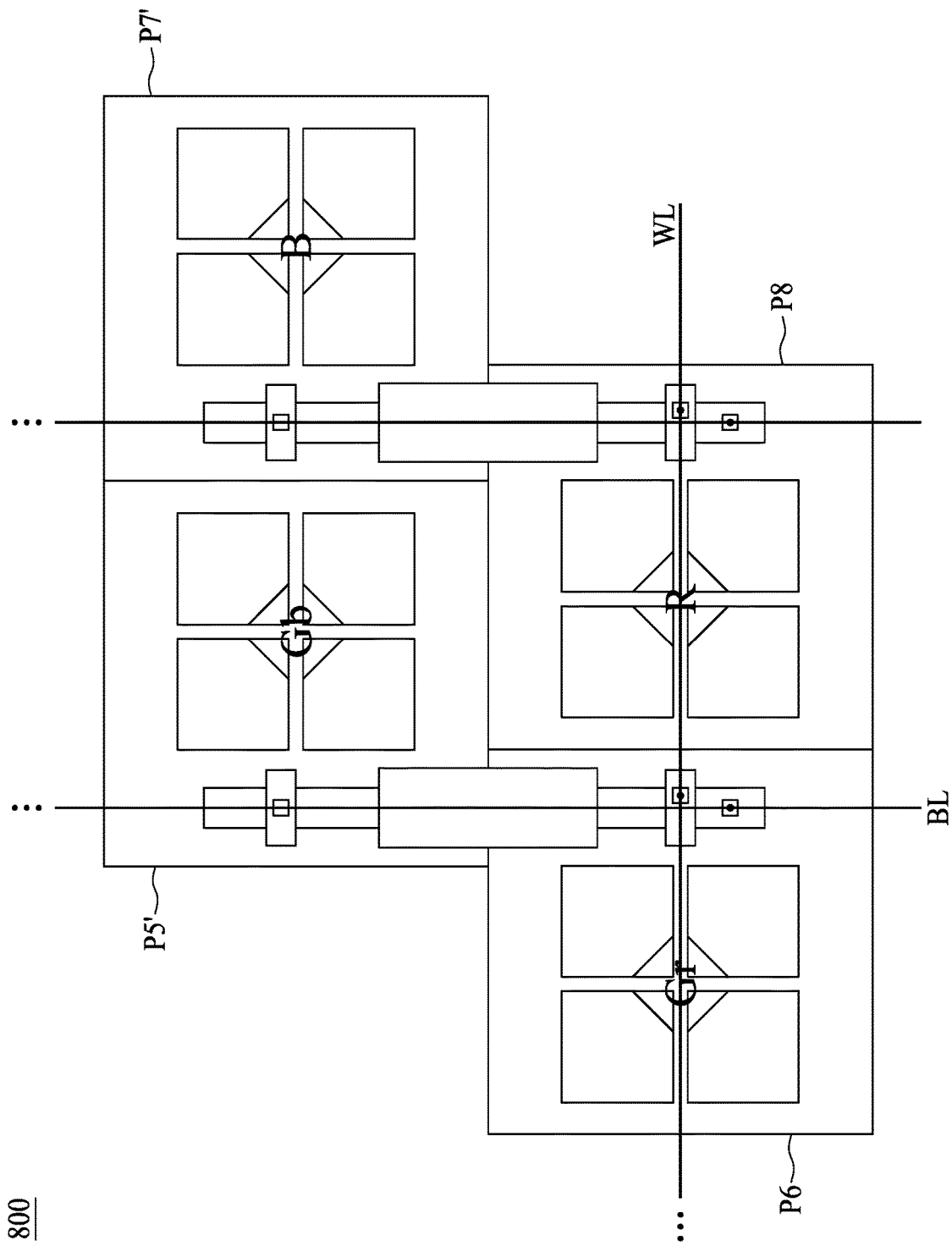
FIG. 3 is a top view of a Bayer pixel group based on the semiconductor structure of an image sensor in FIG. 1 according to a first embodiment of the present application.

In this embodiment, a color filter is disposed above the pixel P5' and the pixel P6. FIG. 3 is further depicted according to a Bayer array arrangement as a pixel group. FIG. 3 shows a top view of a Bayer pixel group based on the semiconductor structure of the image sensor in FIG. 1 according to the first embodiment. The Bayer pixel group 800 in FIG. 3 includes two unit pixel groups shown in FIG. 1, that is, a unit pixel group formed by the pixels P5' and P6, and a unit pixel group formed by pixels P7' and P8. A green Gb color filter is disposed above the photodetectors 502_1, 504_1, 506_1 and 508_1 of the pixel P5', a green Gr color filter is disposed above the photodetectors 502_2, 504_2, 506_2 and 508_2 of the pixel P6, a blue B color filter is disposed above the photodetectors 502_1, 504_1, 506_1 and 508_1 of the pixel P7', and a red R color filter is disposed above the photodetectors 502_2, 504_2, 506_2 and 508_2 of the pixel P8. In other words, from the top view, the green Gb color filter overlaps with the pixel P5', the green Gr color filter overlaps with the pixel P6, the blue B color filter overlaps with the pixel P7', and the red R color filter overlaps with the pixel P8. The pixel P5' and the pixel P6 are disposed diagonally, and the pixel P7' and the pixel P8 are disposed diagonally.

It should be noted that, from the top view, the color filters above can completely overlap with the corresponding pixels; color filters above can partially overlap with the corresponding pixels; or the color filters can cover the corresponding pixels, that is, the areas of the color filters are greater than the areas of the pixel such that the color filters completely cover the corresponding pixels.

In the Bayer pixel group 800 in FIG. 3, the green Gb and Gr color filters are disposed above both the pixel P5' and the pixel P6, and the pixel P5' and the pixel P6 share the output terminal POUT; the blue B and red R color filters are disposed above the pixel P7' and the pixel P8, and the pixel P7' and the pixel P8 share the output terminal POUT. That is to say, the pixel P5' and the pixel P6 enter the same reading circuit through the same bit line BL, achieving an advantage of preventing image imbalance between green pixels Gr and Gb caused by the green pixels Gr and Gb entering different reading circuits. It should be noted that, an error inevitably exists between reading circuits, and if the green pixels Gr and Gb of the same Bayer pixel group enter different reading circuits and are read, the issue of image imbalance described above is caused. Thus, the Bayer pixel group 800 in FIG. 3 can improve the issue of image imbalance described above.

Figure 4:
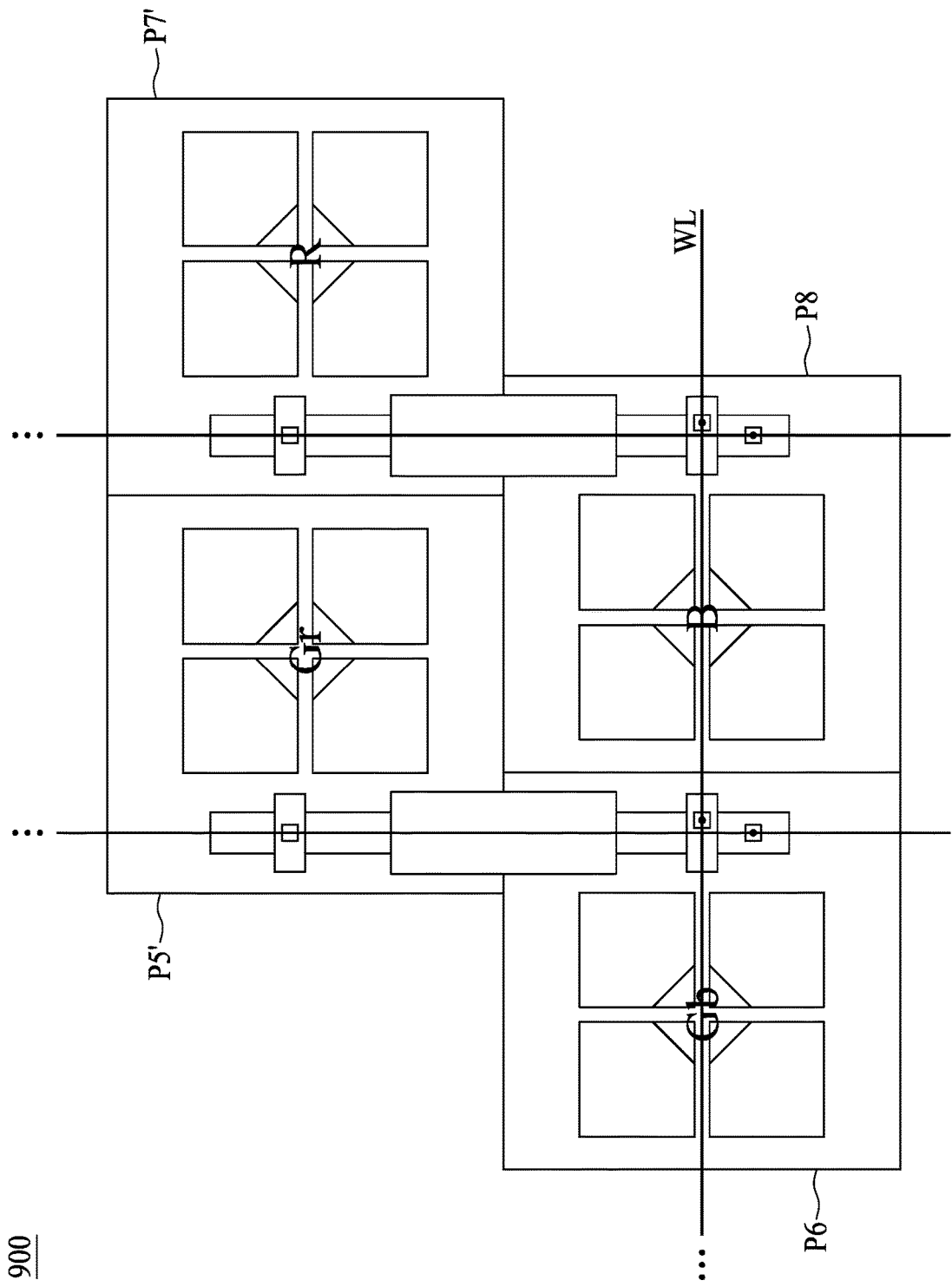
FIG. 4 is a top view of a Bayer pixel group based on the semiconductor structure of an image sensor in FIG. 1 according to a second embodiment of the present application.

FIG. 4 shows a top view of a Bayer pixel group in a semiconductor structure of an image sensor in FIG. 1 according to a second embodiment. Similar to that in FIG. 3, the Bayer pixel group 900 in FIG. 4 includes two of the unit pixel groups shown in FIG. 1, that is, a unit pixel group formed by the pixels P5' and P6, and a unit pixel group formed by the pixels P7' and P8. The difference is that a green Gr filter is disposed above the photodetectors 502_1, 504_1, 506_1 and 508_1 of the pixel P5', a green Gb color filter is disposed above the photodetectors 502_2, 504_2, 506_2 and 508_2 of the pixel P6, a red R color filter is disposed above the photodetectors 502_1, 504_1, 506_1 and 508_1 of the pixel P7', and a blue B color filter is disposed above the photodetectors 502_2, 504_2, 506_2 and 508_2 of the pixel P8. In other words, from the top view, the green Gr color filter overlaps with the pixel P5', the green Gb color filter overlaps with the pixel P6, the red R color filter overlaps with the pixel P7', and the blue B color filter overlaps with the pixel P8. The pixel P5' and the pixel P6 are alternately arranged in diagonal, and the pixel P7' and the pixel P8 are alternately arranged in diagonal. The Bayer pixel group 900 in FIG. 4 has a color configuration slightly different from that of the Bayer pixel group 800 in FIG. 3, but has the same advantage, that is, the pixel P5' and the pixel P6 enter the same reading circuit through the same bit line BL, preventing image imbalance between green pixels Gr and Gb caused by the green pixels Gr and Gb entering different reading circuits.

In conclusion of the above, the present application alternately disposes in diagonal the pixels Gr and Gb of the same color in combination with the configuration of the pixel groups above so as to share an output circuit, achieving consistent output from the first pixel Gr and the third pixel Gb of the same green pixel so as to enhance image quality. Further, on the basis of the shared output circuit, the area of pixels can be decreased, and given a limited semiconductor area, the channel length of a source follower transistor is increased by extending the source follower transistor in the output circuit to next to a photodetector of the first pixel and the third pixel, thereby further decreasing the size of pixels and reducing noise interference. That is, while improving consistency of pixel output and image quality by having the first pixel Gr and the third pixel Gb disposed diagonally share the output circuit, given a smaller size of one single pixel group, the space occupied by the output circuit can be reduced by sharing the output circuit, so as to provide a larger photodetector in a limited space to increase the amount of light received. In addition, the source follower transistor crosses over to next to the photodetector of the two pixels, such that the channel length of the source follower transistor can be further increased without affecting the space occupied by the photodetector so as to improve noise. Therefore, the present application is capable of integrating more pixels in a limited space of an image sensor so as to further achieve high-quality image output.

Figure 5:
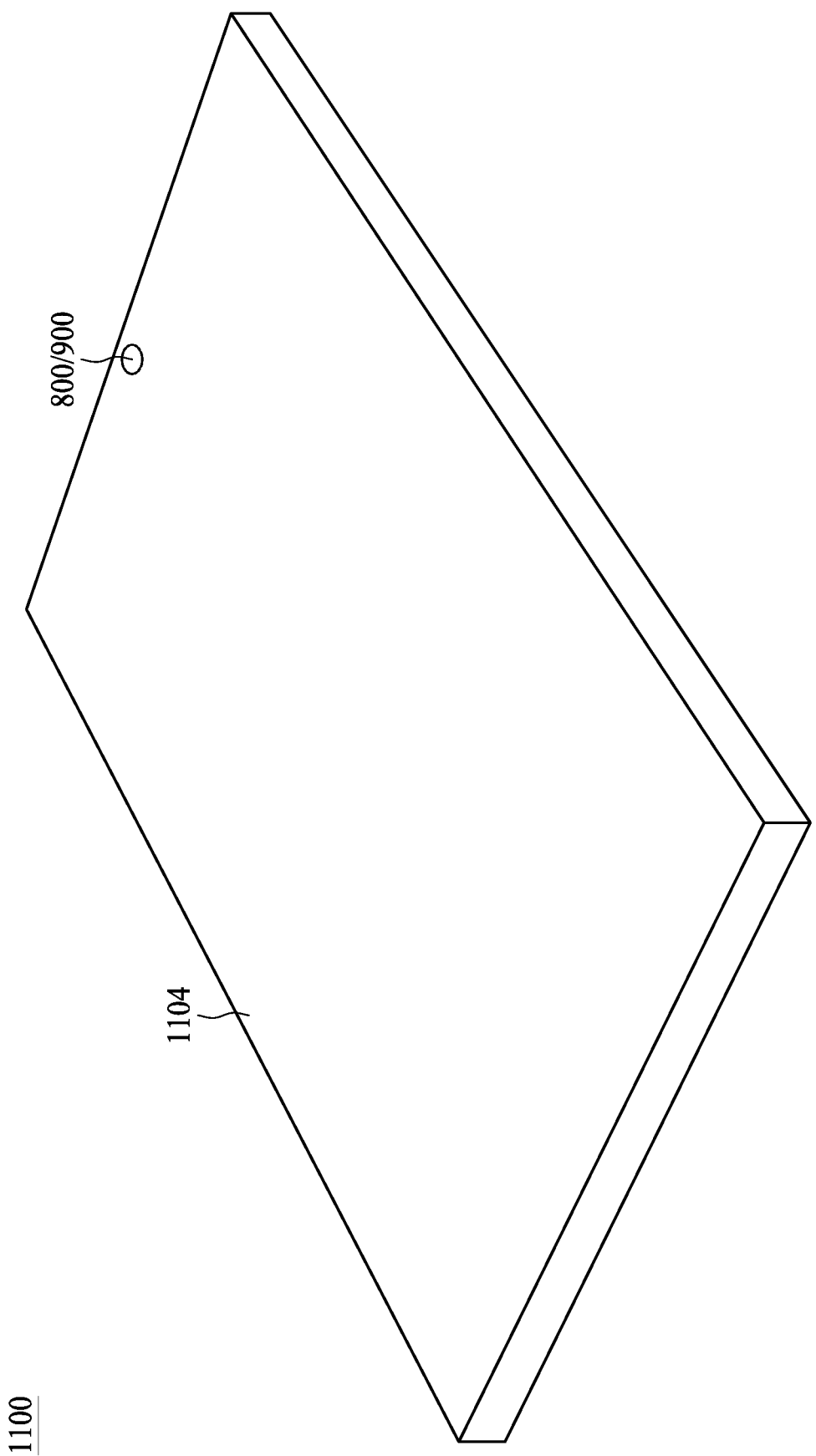
FIG. 5 is a schematic diagram of an image sensor applied to an electronic apparatus according to an embodiment of the present application.

The present application further provides a chip including the image sensor 800/900. The present application further provides an electronic apparatus. FIG. 5 shows a schematic diagram of an image sensor of the present application applied to an electronic apparatus 1100 according to an embodiment. As shown in FIG. 5, the electronic apparatus 1100 includes a display panel assembly 1104 and the image sensor 800/900. The electronic apparatus 1100 can be any electronic apparatus such as a smartphone, a personal digital assistant, a hand-held computer system, a tablet computer system or a digital camera.

The description above briefly provides features of some embodiments of the present application, enabling a person of ordinary skill in the art to more thoroughly understand various forms of the disclosure of the present application. A person of ordinary skill in the art should understand that, on the basis of the disclosure of the present application, it would be easy to design or alter other processes and structures so as to accomplish the same objects and/or achieve the same advantages as those of the embodiments described. A person of ordinary skill in the art should understand that, these equivalent embodiments are still encompassed within the spirit and scope of the present application, and changes, substitutions and modifications can be made thereto without departing from the spirit and scope of the present application.

What is claimed is:

1. A semiconductor structure of an image sensor, being characterized in that:

the semiconductor structure of the image sensor comprises: a semiconductor substrate, and a plurality of pixel groups disposed over the semiconductor substrate; each of the pixel groups comprises: a first pixel and a second pixel located in a same row and being adjacent to each other, and a third pixel and a fourth pixel located in another row and being adjacent to each other, wherein the first pixel and the third pixel are disposed diagonally and the first pixel and the third pixel are pixels of a same color;

each of the first pixel, the second pixel, the third pixel and the fourth pixel comprises four sub-pixels arranged in two columns and two rows, the four sub-pixels of each pixel share a floating diffusion region, and the floating diffusion region is surrounded by photodetectors of the four sub-pixels, and the photodetectors are for converting light into electric charge;

an output circuit is shared by the first pixel and the third pixel, the shared output circuit of the first pixel and the third pixel crosses a boundary between the first pixel and the third pixel and extends to a left/right side of the first pixel and a right/left side of the third pixel, the output circuit is for generating pixel output according to the electric charge, and the output circuit comprises a first source follower transistor;

wherein, from a top view, a part of the first source follower transistor is located to one side of the boundary between the first pixel and the third pixel, and is at least adjacent to the photodetectors on the left/right side of the first pixel, and one other part of the first source follower transistor is located to one other side of the boundary between the first pixel and the third pixel, and is at least adjacent to the photodetectors on the right/left side of the third pixel;

wherein the second pixel and the fourth pixel are disposed diagonally, and an output circuit is shared by the second pixel and the fourth pixel; and wherein the shared output circuit of the second pixel and the fourth pixel is located between the second pixel and the fourth pixel and extends to a left/right side of the second pixel and a right/left side of the fourth pixel.

2. The semiconductor structure of the image sensor according to claim 1, wherein the first pixel and the third pixel are both green pixels.

3. The semiconductor structure of the image sensor according to claim 2, wherein the output circuit further comprises a first row select transistor disposed at the third pixel, and the first row select transistor is adjacent to the photodetectors of the third pixel.

4. The semiconductor structure of the image sensor according to claim 3, wherein the output circuit further comprises a first reset transistor disposed at the first pixel, and the first reset transistor is adjacent to the photodetectors of the first pixel.

5. The semiconductor structure of the image sensor according to claim 4, wherein from a top view, the first row select transistor, the first source follower transistor and the first reset transistor are arranged in one column to form a transistor column.

6. The semiconductor structure of the image sensor according to claim 3, wherein the output circuit outputs the pixel output by using one source/drain of the first row select transistor as an output terminal.

7. The semiconductor structure of the image sensor according to claim 4, wherein from a top view, the first source follower transistor is disposed between the first reset transistor and the first row select transistor.

8. The semiconductor structure of the image sensor according to claim 7, wherein the first row select transistor and the first reset transistor are symmetrically disposed along the first source follower transistor.

9. The semiconductor structure of the image sensor according to claim 2, wherein each of the four sub-pixels of each pixel comprises a transmission gate, and each transmission gate is located in a region where each of the photodetectors of the four sub-pixels is located.

10. The semiconductor structure of the image sensor according to claim 9, wherein from a top view, the transmission gates of the first pixel, the second pixel, the third pixel and the fourth pixel are evenly arranged in the pixel where they are located.

11. The semiconductor structure of the image sensor according to claim 1, wherein the shared output circuit of the second pixel and the fourth pixel comprises a second source follower transistor, the second source follower transistor crosses a boundary between the second pixel and the fourth pixel, and at least extends to be adjacent to the light sensors on the left/right side of the second pixel and at least extends to be adjacent to the light sensors on the right/left side of the fourth pixel.

12. The semiconductor structure of the image sensor according to claim 11, wherein the shared output circuit of the second pixel and the fourth pixel further comprises a second row select transistor and a second reset transistor, the second row select transistor is disposed at the fourth pixel, the second row select transistor is adjacent to the light sensors of the fourth pixel, the second reset transistor is disposed at the second pixel, and the second reset transistor is adjacent to the light sensors of the second pixel.

13. The semiconductor structure of the image sensor according to claim 12, wherein from a top view, the second row select transistor, the second source follower transistor and the second reset transistor are arranged in a column to form a transistor column.

14. The semiconductor structure of the image sensor according to claim 13, wherein from a top view, the second source follower transistor is disposed between the second reset transistor and the second row select transistor.

15. The semiconductor structure of the image sensor according to claim 14, wherein the four sub-pixels of each pixel are of a same color.

16. The semiconductor structure of the image sensor according to claim 15, wherein the second pixel is a blue pixel, the fourth pixel is red and the first pixel, the second pixel, the third pixel and the fourth pixel form a Bayer array.

17. A chip, being characterized in comprising:
the semiconductor structure of the image sensor of claim 1.

18. An electronic apparatus, being characterized in comprising:
the semiconductor structure of the image sensor of claim 1.

* * * * *